(12) United States Patent
Elmoursi et al.

(10) Patent No.: US 7,476,422 B2
(45) Date of Patent: Jan. 13, 2009

(54) COPPER CIRCUIT FORMED BY KINETIC SPRAY

(75) Inventors: Alaa A. Elmoursi, Troy, MI (US); Frans P. Lautzenhiser, Collegeville, PA (US); Albert B. Campbell, Detroit, MI (US); John R. Smith, Birmingham, MI (US)

(73) Assignee: Delphi Technologies, Inc., Troy, MI (US)

( * ) Notice: Subject to any disclaimer, the term of this patent is extended or adjusted under 35 U.S.C. 154(b) by 299 days.

(21) Appl. No.: 10/154,342

(22) Filed: May 23, 2002

(65) Prior Publication Data

US 2003/0219576 A1 Nov. 27, 2003

(51) Int. Cl.
*B05D 5/12* (2006.01)
*B05D 1/08* (2006.01)
*C23C 4/08* (2006.01)

(52) U.S. Cl. ............ 427/446; 427/96.1; 427/448; 427/455

(58) Field of Classification Search ............ 427/96, 427/180, 191, 192, 199, 202, 205, 427, 446, 427/448, 455, 96.1; 148/156
See application file for complete search history.

(56) References Cited

U.S. PATENT DOCUMENTS

| | | |
|---|---|---|
| 2,861,900 A | 11/1958 | Smith et al. |
| 3,100,724 A | 8/1963 | Rocheville |
| 3,876,456 A | 4/1975 | Ford et al. |
| 3,993,411 A | 11/1976 | Babcock et al. |
| 3,996,398 A | 12/1976 | Manfredi |
| 4,263,335 A | 4/1981 | Wagner et al. |
| 4,416,421 A | 11/1983 | Browning et al. |
| 4,606,495 A | 8/1986 | Stewart, Jr. et al. |

(Continued)

FOREIGN PATENT DOCUMENTS

DE 23 18 886 B1 10/1974

(Continued)

OTHER PUBLICATIONS

Stoltenhoff, Cold Spraying—A Study of Process and coating characteristics, pp. 419-422.*

(Continued)

*Primary Examiner*—Brian K Talbot
(74) *Attorney, Agent, or Firm*—Thomas N. Twomey

(57) ABSTRACT

The invention concerns a copper-based circuit having an electrically insulative substrate, a bond layer including silver formed over select portions of the substrate according to a desired shape of the circuit, and an electrically conductive layer including plastically deformed particles of copper deposited on the bond layer. Furthermore, the invention also concerns a process for forming a copper-based circuit, wherein the process includes the steps of providing an electrically insulative substrate, forming a bond layer including silver over select portions of the substrate according to a desired shape of the circuit, and depositing copper on the bond layer by the steps of introducing copper particles into a pressurized carrier gas, forming the pressurized carrier gas and the copper particles into a supersonic jet, and directing the jet toward the bond layer formed over the substrate such that the jet has a velocity sufficient to cause plastic deformation of the copper particles onto the bond layer, thereby forming an electrically conductive layer on the bond layer.

8 Claims, 4 Drawing Sheets

U.S. PATENT DOCUMENTS

| | | |
|---|---|---|
| 4,891,275 A | 1/1990 | Knoll |
| 4,939,022 A | 7/1990 | Palanisamy |
| 5,187,021 A | 2/1993 | Vydra et al. |
| 5,217,746 A | 6/1993 | Lenling et al. |
| 5,271,965 A | 12/1993 | Browning |
| 5,281,326 A | 1/1994 | Galla |
| 5,302,414 A * | 4/1994 | Alkhimov et al. ............ 427/192 |
| 5,308,463 A | 5/1994 | Hoffmann et al. |
| 5,328,751 A * | 7/1994 | Komorita et al. ............ 428/209 |
| 5,340,015 A | 8/1994 | Hira et al. |
| 5,362,523 A | 11/1994 | Gorynin et al. |
| 5,395,679 A | 3/1995 | Myers et al. |
| 5,424,101 A | 6/1995 | Atkins et al. |
| 5,464,146 A | 11/1995 | Zalvzec et al. |
| 5,465,627 A | 11/1995 | Garshelis |
| 5,476,725 A | 12/1995 | Papich et al. |
| 5,493,921 A | 2/1996 | Alasafi |
| 5,520,059 A | 5/1996 | Garshelis |
| 5,525,570 A | 6/1996 | Chakraborty et al. |
| 5,527,627 A | 6/1996 | Lautzenhiser et al. |
| 5,585,574 A | 12/1996 | Sugihara et al. |
| 5,593,740 A | 1/1997 | Strumbon et al. |
| 5,648,123 A | 7/1997 | Kuhn et al. |
| 5,683,615 A | 11/1997 | Munoz |
| 5,706,572 A | 1/1998 | Garshelis |
| 5,708,216 A | 1/1998 | Garshelis |
| 5,725,023 A | 3/1998 | Padula |
| 5,795,626 A | 8/1998 | Gabel et al. |
| 5,854,966 A | 12/1998 | Kampe et al. |
| 5,875,830 A | 3/1999 | Singer et al. |
| 5,887,335 A | 3/1999 | Garshelis |
| 5,889,215 A | 3/1999 | Kilmartin et al. |
| 5,894,054 A | 4/1999 | Paruchuri et al. |
| 5,907,105 A | 5/1999 | Pinkerton |
| 5,907,761 A | 5/1999 | Tohma et al. |
| 5,952,056 A | 9/1999 | Jordan et al. |
| 5,965,193 A | 10/1999 | Ning et al. |
| 5,989,310 A | 11/1999 | Chu et al. |
| 5,993,565 A | 11/1999 | Pinkerton |
| 6,033,622 A | 3/2000 | Maruyama |
| 6,047,605 A | 4/2000 | Garshelis |
| 6,051,045 A | 4/2000 | Narula et al. |
| 6,051,277 A | 4/2000 | Claussen et al. |
| 6,074,737 A | 6/2000 | Jordan et al. |
| 6,098,741 A | 8/2000 | Gluf |
| 6,119,667 A | 9/2000 | Boyer et al. |
| 6,129,948 A | 10/2000 | Plummet et al. |
| 6,139,913 A * | 10/2000 | Van Steenkiste et al. .... 427/191 |
| 6,145,387 A | 11/2000 | Garshelis |
| 6,149,736 A | 11/2000 | Sukigara |
| 6,159,430 A | 12/2000 | Foster |
| 6,189,663 B1 | 2/2001 | Smith et al. |
| 6,260,423 B1 | 7/2001 | Garshelis |
| 6,261,703 B1 * | 7/2001 | Sasaki et al. ................ 428/627 |
| 6,283,386 B1 | 9/2001 | Van Steenkiste et al. |
| 6,283,859 B1 | 9/2001 | Carlson et al. |
| 6,289,748 B1 | 9/2001 | Lin et al. |
| 6,291,012 B1 * | 9/2001 | Miyasaka ................... 427/191 |
| 6,317,913 B1 | 11/2001 | Kilmer et al. |
| 6,338,827 B1 | 1/2002 | Nelson et al. |
| 6,344,237 B1 | 2/2002 | Kilmer et al. |
| 6,374,664 B1 | 4/2002 | Bauer |
| 6,402,050 B1 | 6/2002 | Kashirin et al. |
| 6,422,360 B1 | 7/2002 | Oliver et al. |
| 6,424,896 B1 | 7/2002 | Lin |
| 6,442,039 B1 | 8/2002 | Schreiber |
| 6,446,857 B1 | 9/2002 | Kent et al. |
| 6,465,039 B1 | 10/2002 | Pinkerton et al. |
| 6,485,852 B1 | 11/2002 | Miller et al. |
| 6,488,115 B1 | 12/2002 | Ozsoylu |
| 6,490,934 B2 | 12/2002 | Garshelis |
| 6,511,135 B2 | 1/2003 | Ballinger et al. |
| 6,537,507 B2 | 3/2003 | Nelson et al. |
| 6,551,734 B1 | 4/2003 | Simpkins et al. |
| 6,553,847 B2 | 4/2003 | Garshelis |
| 6,615,488 B2 | 9/2003 | Anders |
| 6,623,704 B1 | 9/2003 | Roth |
| 6,623,796 B1 | 9/2003 | VanSteenkiste |
| 6,624,113 B2 | 9/2003 | LaBarge et al. |
| 6,924,004 B2 * | 8/2005 | Rao et al. ................ 427/421.1 |
| 2002/0071906 A1 | 6/2002 | Rusch |
| 2002/0073982 A1 | 6/2002 | Shaikh et al. |
| 2002/0102360 A1 | 8/2002 | Subramanian et al. |
| 2002/0110682 A1 | 8/2002 | Brogan |
| 2002/0112549 A1 | 8/2002 | Cheshmehdoost et al. |
| 2002/0182311 A1 | 12/2002 | Leonardi et al. |
| 2003/0039856 A1 | 2/2003 | Gillispie et al. |
| 2003/0190414 A1 | 10/2003 | VanSteenkiste |
| 2003/0219542 A1 | 11/2003 | Ewasyshyn et al. |

FOREIGN PATENT DOCUMENTS

| | | |
|---|---|---|
| DE | 42 36 911 | 12/1993 |
| DE | 199 59 515 | 6/2001 |
| DE | 100 37 212 | 1/2002 |
| DE | 101 26 100 | 12/2002 |
| EP | 0 860 516 A | 8/1998 |
| EP | 1 160 348 | 12/2001 |
| EP | 1245854 A2 | 2/2002 |
| JP | 55031161 | 3/1980 |
| JP | 61249541 | 11/1986 |
| JP | 04180770 | 6/1992 |
| JP | 04243524 | 8/1992 |
| WO | 98/22639 | 5/1998 |
| WO | 02/52064 | 1/2002 |
| WO | 03009934 | 2/2003 |

OTHER PUBLICATIONS

Van Steenkiste, et al; *Kinetic Spray Coatings*; in Surface & Coatings Technology III; 1999; pp. 62-71.

Liu, et al; *Recent Development in the Fabrication of Metal Matrix-Particulate Composites Using Powder Metallurgy Techniques*; in Journal of Material Science 29; 1994; pp. 1999-2007; National University of Singapore, Japan.

Papyrin; *The Cold Gas-Dynamic Spraying Method a New Method for Coatings Deposition Promises a New Generation of Technologies*; Novasibirsk, Russia.

McCune, al; Characterization of Copper and Steel Coatings Made by the Cold Gas-Dynamic Spray Method; National Thermal Spray Conference.

Stoner et al; *Measurements of the Kapitza Conductance between Diamond and Several Metals*; Physical Review Letters, vol. 68, No. 10; Mar. 9, 1992; pp. 1563-1566.

Stoner et al; *Kapitza conductance and heat flow between solids at temperatures from 50 to 300K*; Physical Review B, vol. 48, No. 22, Dec. 1, 1993-II; pp. 16374;16387.

Johnson et al; *Diamond/Al metal matrix composites formed by the pressureless metal infiltration process*; J. Mater, Res., vol. 8, No. 5, May 1993; pp. 11691173.

Rajan et al; *Reinforcement coatings and interfaces in Aluminium Metal Matrix Composites*; pp. 3491-3503.

*LEC Manufacturing and Engineering Capabilities*; Lanxide Electronic Components, Inc.

Dykhuizen et al; *Gas Dynamic Principles of Cold Spray*; Journal of Thermal Spray Technology; Jun. 1998; pp. 205-212.

McCune et al; *An Exploration of the Cold Gas-Dynamic Spray Method For Several Materials Systems*.

Ibrahim et al; *Particulate Reinforced Metal Matrix Composites—A Review*; Journal of Matrials Science 26; pp. 1137-1156.

I.J. Garshelis, et al; *A Magnetoelastic Torque Transducer Utilizing a Ring Divided into Two Oppositely Polarized Circumferential Regions*; MMM 1995; Paper No. BB-08.

I.J. Garshelis, et al; *Development of a Non-Contact Torque Transducer for Electric Power Steering Systems*; SAE Paper No. 920707; 1992; pp. 173-182.

Boley, et al; *The Effects of Heat Treatment on the Magnetic Behavior of Ring-Type Magnetoelastic Torque Sensors*; Proceedings of Sicon '01; Nov. 2001.

J.E. Snyder, et al; *Low Coercivity Magnetostrictive Material with Giant Piezomagnetic d33*, Abstract Submitted for the Mar. 1999 Meeting of the American Physical Society.

McCune, et al; *An Exploration of the Cold Gas-Dynamic Spray Method . . .* ; Proc. Nat. Thermal Spray Conf. ASM Sep. 1995.

Pavel Ripka, et al; *Pulse Excitation of Micro-Fluxgate Sensors*, IEEE Transactions on Magnetics, vol. 37, No. 4, Jul. 2001, pp. 1998-2000.

Trifon M. Liakopoulos, et al; *Ultrahigh Resolution DC Magnetic Field Measurements Using Microfabricated Fluxgate Sensor Chips*, University of Cincinnati, Ohio, Center for Microelectronic Sensors and MEMS, Dept. of ECECS pp. 630-631.

Derac Son, *A New Type of Fluxgate Magnetometer Using Apparent Coercive Field Strength Measurement*, IEEE Transactions on Magnetics, vol. 25, No. 5, Sep. 1989, pp. 3420-3422.

O. Dezauri, et al; *Printed Circuit Board Integrated Fluxgate Sensor*, Elsevier Science S. A. (2000) Sensors and Actuators, pp. 200-203.

How, et al; *Generation of High-Order Harmonics in Insulator Magnetic Fluxgate Sensor Cores*, IEEE Transactions on Magnetics, vol. 37, No. 4, Jul. 2001, pp. 2448-2450.

Moreland, *Fluxgate Magnetometer*, Carl W. Moreland, 199-2000, pp. 1-9.

Ripka, et al; *Symmetrical Core Improves Micro-Fluxgate Sensors*, Sensors and Acutuators, Version 1, Aug. 25, 2000, pp. 1-9.

Hoton How, et al; *Development of High-Sensitivity Fluxgate Magnetometer Using Single-Crystal Yttrium Iron Garnet Thick Film as the Core Material*, ElectroMagnnetic Applications, Inc.

Ripka, et al; *Microfluxgate Sensor with Closed Core*, submitted for Sensors and Actuators, Version 1, Jun. 17, 2000.

Henriksen, et al; *Digital Detection and Feedback Fluxgate Magnetometer*, Meas. Sci. Technol. 7 (1996) pp. 897-903.

Cetek 930580 Compass Sensor, *Specifications*, Jun. 1997.

Geyger, *Basic Principles Characteristics and Applications*, Magnetic Amplifier Circuits, 1954, pp. 219-232.

European Search Report dated May 31, 2005.

Alkhimov, et al; *A Method of "Cold" Gas-Dynamic Deposition; Sov. Phys. Kokl.* 36(12; Dec. 1990; pp. 1047-1049.

Dykuizen, et al; *Impact of High Velocity Cold Spray Particles*; in Journal of Thermal Spray Technology 8(3); 1999; pp. 559-564.

Swartz, et al; *Thermal Resistance At Interfaces; Appl. Phys. Lett.*, vol. 51, No. 26,28; Dec. 1987; pp. 2201-2201.

Davis, et al; *Thermal Conductivity of Metal-Matrix Composlites; J.Appl. Phys.* 77 (10), May 15, 1995; pp. 4494-4960.

Trifon M. Liakopoulos, et al; *Ultrahigh Resolution DC Magnetic Field Measurements Using Microfabricated Fluxgate Sensor Chips*, University of Cincinnati, Ohio, Center for Microelectronic Sensors and MEMS, Dept. of ECECS pp. 630-631 no date.

European Search Report dated Jan. 29, 2004, and it's Annex.

\* cited by examiner

COPPER CIRCUIT FORMED BY KINETIC SPRAY

TECHNICAL FIELD

The present invention relates to copper-based interconnect circuits formed on substrates.

BACKGROUND OF THE INVENTION

With the increased incorporation of electronic components and electrical systems in modern motor vehicles, there is a greater need for components and systems having circuits with high-current and better thermal management capabilities. Circuits with such capabilities are necessary to satisfy the high-power applications and requirements which are common in such modern motor vehicles. In addition to automotive applications, such circuits may lead to improved thermal management in electronic devices ranging from SCR's to high power MOSFET's and microprocessors. In general, for a circuit to meet such criteria, the metal conducting path must be sufficiently thick to minimize heat generation and to conduct or spread the heat or thermal energy to assist in circuit cooling.

One prior art solution to fabricating thick circuits with high-current and better thermal management capabilities has been to utilize ultra-thick film technology in which a circuit line of silver is screen printed in single or multiple layers, depending on the required thickness of the circuit. For examples, see U.S. Pat. No. 5,395,679 issued to Myers et al on Mar. 7, 1995, and see also U.S. Pat. No. 5,527,627 issued to Lautzenhiser et al on Jun. 18, 1996. However, in attempting to form a circuit line of a particular thickness by overlay printing of multiple layers of silver, the first layer is limited to a practical thickness of only about 0.15 millimeters (6 mils). Additional layers are limited to thicknesses of only about 0.075 millimeters (3 mils). In addition to having to print multiple layers on top of each other to obtain a circuit line with sufficient thickness, it is also necessary to fire each deposited layer before proceeding to deposit the next layer. Thus, a first drawback to this method is that it requires multiple processing steps and additional time to form a sufficiently thick multi-layer circuit line wherein each layer must be fired before the next layer can be applied. In addition, a second drawback to this method is that, when dealing with surface mount technologies (SMT), there are significant problems associated with soldering a pre-fabricated electronic component to a silver circuit line. This includes silver leaching during the solder reflow process, and the undesired growth of brittle tin-silver intermetallic compounds.

Another approach is to utilize a process for the metallization of alumina called "direct bond copper." See, for example, U.S. Pat. No. 3,993,411 issued to Babcock et al on Nov. 23, 1976. In this process, a thin copper foil is directly bonded to an alumina substrate under a very stringently controlled environment. The desired circuit line, which is to be formed from the copper foil, is covered and protected with a chemical-resist mask, and the remaining copper foil which is not protected by the mask is thereafter etched away. In this way, the remaining un-etched copper foil defines the circuit line. However, with this approach, the-thickness of the copper circuit line is limited to about 0.5 millimeters (20 mils) because a thicker copper circuit line would begin to exhibit poorer adhesion to the alumina substrate. In addition, a thicker copper foil is more expensive to process because of the additional time required to etch the unprotected thicker copper foil.

Although both of the above-mentioned methods involve standard processes, neither one of them provides a low-cost way to fabricate sufficiently thick circuit lines having high-current and good thermal management capabilities. Thus, there remains a present need in the art for the low-cost fabrication of thick films of copper, preferably several millimeters thick, having high-current and good thermal management capabilities. An example of a high current application is one requiring electrical current on the order of 10 to 200 amperes.

SUMMARY OF THE INVENTION

The present invention provides a copper-based circuit for use in high-current applications. According to one embodiment of the invention, the copper-based circuit has an electrically insulative substrate, a bond layer including silver which is formed over select portions of the substrate according to a desired shape of the circuit, and an electrically conductive layer including plastically deformed particles of copper deposited on the bond layer. In another embodiment of the invention, the copper particles are directly deposited onto a substrate without utilizing a bond layer. The copper particles are selected to have particle size in a range which permits adherence to the substrate without the bond layer. As used herein, the term particle size refers to the size of particles obtained by sieve. The term particle size and the term particle diameter are typically used interchangeably in the art. Here, as stated, such relates to the dimension obtained by sieving.

According to preferred embodiments of the present invention, the substrate may include aluminum oxide, aluminum nitride, or boron nitride. The bond layer may include, for example, a silver-palladium alloy. In one embodiment of the present invention, the bond layer has a preferred thickness of approximately 10 to 12 micrometers.

In another aspect, the present invention also provides a process for forming the copper-based circuit on a substrate. In one aspect, the process includes the steps of providing an electrically insulative substrate, forming a bond layer including silver over select portions of the substrate according to a desired shape of the circuit, and depositing copper on the bond layer. According to one alternative of the process, the silver-based bond layer is placed over select portions of the substrate by a screen printing technique.

The step of depositing copper on the bond layer includes the steps of introducing copper particles into a pressurized carrier gas, forming the pressurized carrier gas and the copper particles into a supersonic jet, and directing the jet toward the bond layer. The jet has a velocity sufficient to cause plastic deformation of the copper particles onto the bond layer. In this way, an electrically conductive layer is thereby formed on the bond layer and is well-adhered thereto.

Desirably, each copper particle has a diameter of about 25 micrometers to about 150 micrometers. Preferably, each copper particle has a diameter of about 45 micrometers to about 65 micrometers when deposited onto a bond layer. Preferably, the particles have a size of 45 micrometers or less when deposited without a bond layer. Most preferably, the particles have a size of 25 micrometers or less when deposited onto a substrate without the bond layer. While the powder particles are roughly spherical, the deposited particles have been somewhat flattened (aspect ratios in the range of 3:1 to 5:1). Deposited particles tend to fill available volume (voids) in the coating.

Preferably, the carrier gas has a pressure of about 1.2 MPa to about 2 MPa, and has a temperature of about 100° C. to about 500° C. The jet is preferably directed substantially normal with respect to the surface of the bond layer formed over the substrate. In addition, the jet is directed at the surface of the bond layer on the substrate from a preferred standoff distance of about 4 millimeters to about 45 millimeters, and more preferably from a standoff distance of about 6 millimeters to about 44 millimeters. Most preferably, the jet is directed to the surface of the bond layer from a standoff distance of about 19 millimeters. In this way, the kinetic energies of the copper particles are transferred to the bond layer upon impact such that the copper particles are plastically deformed and will properly accumulate and adhere to the bond layer.

Advantages, design considerations, and applications of the present invention will become apparent to those skilled in the art when the detailed description of the best mode contemplated for practicing the invention, as set forth hereinbelow, is read in conjunction with the accompanying drawings.

BRIEF DESCRIPTION OF THE DRAWINGS

The present invention will now be described, by way of example, with reference to the following drawings.

DESCRIPTION OF THE PREFERRED EMBODIMENTS

The preferred structure and fabrication method for a copper-based circuit formed by kinetic spray, according to the present invention, is set forth hereinbelow. Through experimentation, copper-based circuits formed according to the present invention are demonstrated to have thicknesses of up to and exceeding several millimeters per pass. Substantially thicker coatings are obtainable from multiple passes. As a result of such thicknesses, copper-based circuits formed according to the present invention inherently have high-current and better heat spreading and thermal management capabilities suitable for high-power electronic applications.

Figure 1:
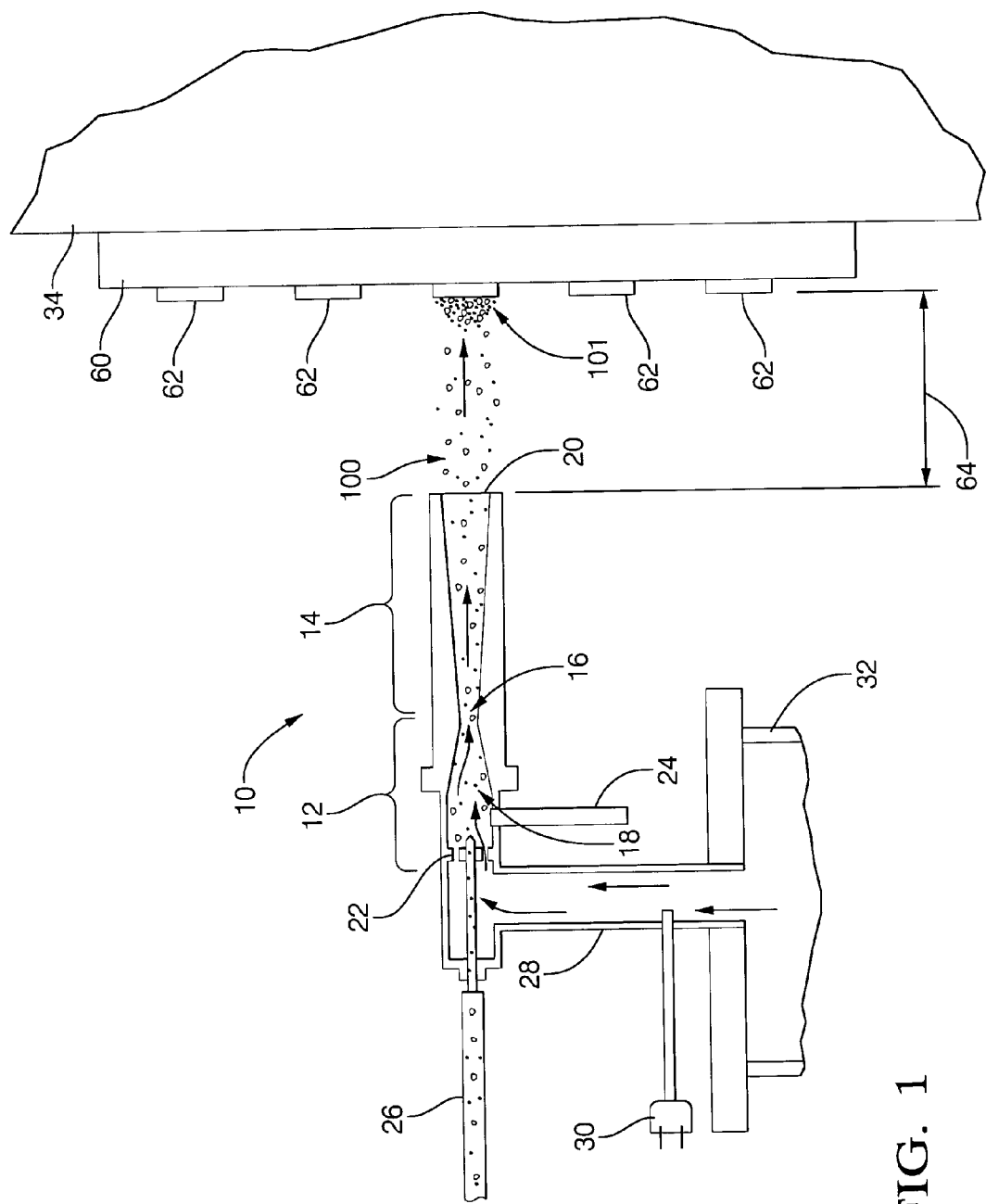
FIG. 1 is a cross-sectional view particularly highlighting a spray nozzle for directing copper particles onto a silver bond layer formed upon an alumina substrate.

According to a preferred embodiment of the present invention, FIG. 1 is a cross-sectional view particularly highlighting a kinetic spray nozzle 10 for directing copper particles 100 onto one or more silver bond layers 62 formed upon a substrate 60. The spray nozzle 10 used in the experiments was a de Laval type which has a hollow, conic-shaped chamber which defines a converging sonic region 12 within the nozzle 10. The converging sonic region 12 has a decreasing diameter which ultimately forms a small circular aperture which defines a throat 16 within the nozzle 10. Opposite the converging sonic region 12, another hollow chamber defines a supersonic region 14. The supersonic region 14 diverges and forms a rectangular exit aperture 20 at the exit end of the nozzle 10.

In FIG. 1, the exit aperture of a powder feed line 26 is introduced into nozzle 10 at the non-converging end of the sonic region 12. The powder feed line 26 thereby serves as means for introducing into the sonic region 12 one or more pre-selected powders containing copper particles. Further incorporated in the non-converging end of the sonic region 12 is a structure having one or more apertures defining a flow straightener 22. The flow straightener 22 serves as means for permitting the streamlined introduction of a gas into the non-converging end of the sonic region 12. The gas is directed through the flow straightener 22 by a gas conduit 28 leading from an in-line gas heater 32. According to a preferred embodiment of the present invention, the gas heater 32 can produce a gas temperature as high as 650° C. Incorporated within the gas conduit 28 is a thermocouple 30 which monitors the temperature of the gas passing through the conduit 28. In this arrangement, the sonic region 12 defines a mixing chamber 18 in which a powder introduced by the feed line 26 and a gas introduced by the flow straightener 22 are mixed before being expelled via the throat 16 and the supersonic region 14 of the nozzle 10. In order to determine the pressure within the mixing chamber 18, a pressure sensor 24 is used.

Figure 2:
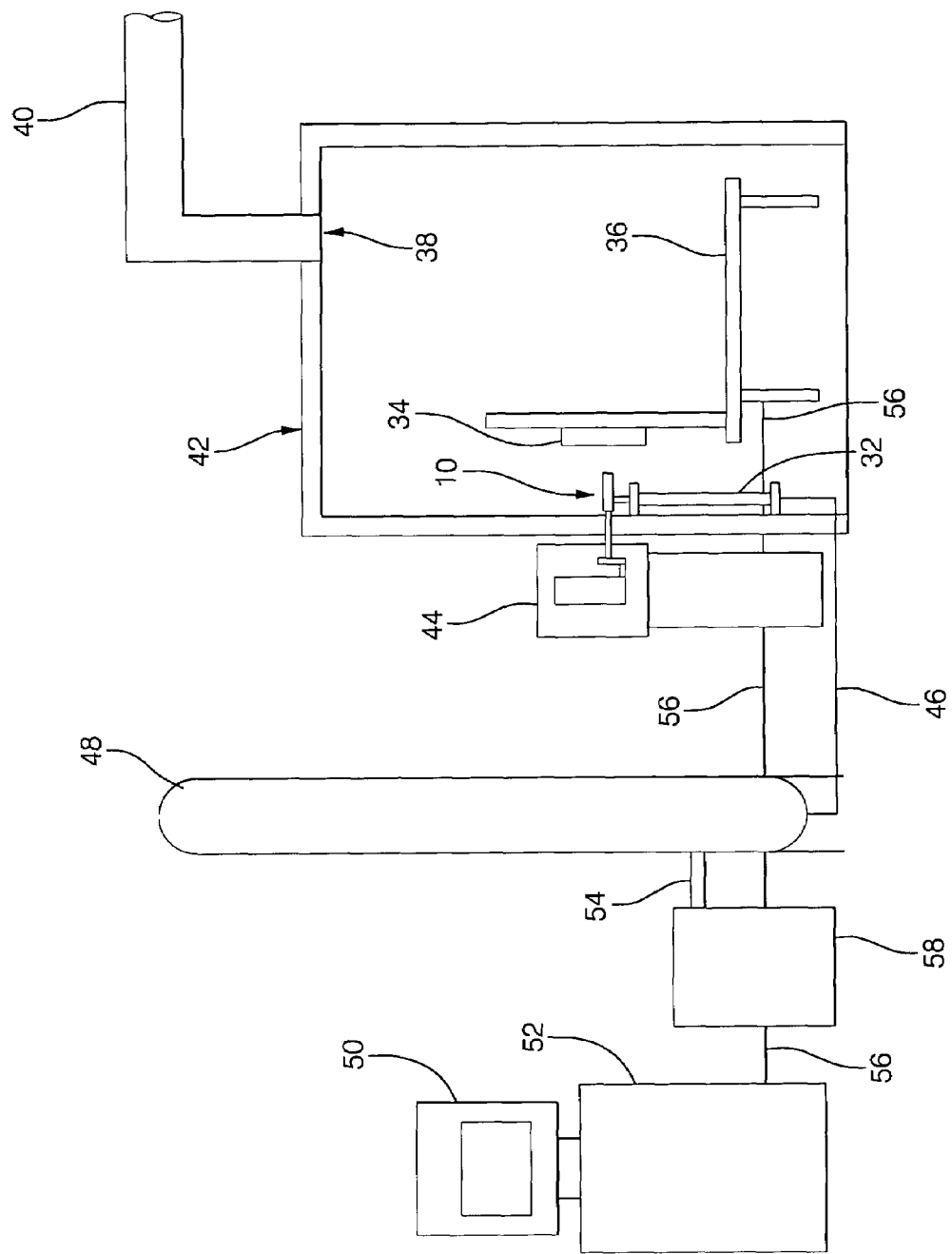
FIG. 2 is a view particularly highlighting a kinetic spray system layout.

FIG. 2 shows the general layout of a kinetic spray system in accordance with the present invention. Consistent with the present invention, it is to be understood that other spray systems, such as, for example, the spray system disclosed in U.S. Pat. No. 5,302,414, issued to Alkhimov et al on Apr. 12, 1994, and as disclosed in allowed Ser. No. 09/343,016 owned by the assignee of the present invention, each of which are incorporated herein by reference in its entirety, is adaptable for utilization consistent with the present invention as well. However, as particularly illustrated in FIG. 2, the nozzle 10 and gas heater 32 are situated within a spray deposition chamber 42. The chamber 42 has a vent 38 which permits the evacuation of gas and/or particulates via a conduit 40 which is connected to, for example, a dust collector. Also within the chamber 42 is a target mounting pad 34 which is supported on a manipulatable x-y-z rotation motion stage 36. The target mounting pad 34 is selectively moved and positioned relative to the exit aperture 20 of the nozzle 10 by the motion stage 36.

Further in FIG. 2, situated outside of the spray deposition chamber 42 is a high-pressure powder feeder 44. A preferred powder feeder is sold by Powder Feeder Dynamics, Inc., under the designation Markxuird Precision Powder Feeder. The powder feeder 44 delivers one or more powders, comprising copper particles or an alloy thereof, into the mixing chamber 18 of the nozzle 10 via the powder feed line 26. Also situated outside of the chamber 42 is an air compressor 58 pneumatically connected to an air ballast tank 48 via an air conduit 54. In this preferred experimental arrangement, the air compressor 58 is preferably a Bauer-type air compressor which provides pressures of up to about 3.4 MPa (500 psi). The compressor 58 delivers pressurized air or gas into tank 48, which serves as a temporary reservoir of pressurized air or gas, for ultimate delivery into heater 32 via a conduit 46.

Further included in the general layout of the kinetic spray system of FIG. 2 is a computer 52 with user monitor 50. The computer 52 is electronically connected via a computer control line 56 to the above-described components of the kinetic spray system. In particular, the computer 52 serves to control and monitor the gas inlet temperature within the nozzle 10 by electronically controlling the temperature of the in-line heater 32 and by electronically sensing the gas temperature with the thermocouple 30. In addition, the computer 52 monitors and controls the gas inlet pressure within the nozzle 10 by electronically controlling the air compressor 58 in response to the pressure within the mixing chamber 18 determined by the pressure sensor 24. The inlet pressure and the powder feed rate associated with the powder feeder 44 are also monitored and controlled by the computer 52. Finally, the computer 52 also controls the rate and direction of movement of the motion stage 36 In this way, the rate of movement and positioning of the target mounting pad 34 with respect to the exit aperture 20 of the nozzle 10 is closely controlled.

Referring back to FIG. 1, a target according to the present invention is detachably mounted to the mounting pad 34. In particular, the target comprises an electrically insulative substrate 60 having, in this embodiment, horizontal bond layers 62 formed on the substrate 60. According to a preferred embodiment of the present invention, the substrate should have a breakdown voltage of at least 500 volts for automotive applications, and of that order for SCR's, high power MOSFET's and microprocessors in non-automotive applications and comprises, but is not limited to, insulators such as aluminum-oxide (alumina, $Al_2O_3$), aluminum-nitride (AlN), or boron-nitride (BN). Such substrate materials are preferred because of their beneficial thermal management and heat spreading capabilities as well as their desirable breakdown voltages. In particular, alumina has a thermal conductivity of about 25 to 35 Watts/(m ° K) and a breakdown voltage of about $1\times10^7$ volts/meter. Aluminum-nitride, on the other hand, has a thermal conductivity of about 175 to 220 Watts/(m ° K) and a breakdown voltage of $1.5\times10^7$ volts/meter. Lastly, boron-nitride has a thermal conductivity of about 700 Watts/(m ° K). The bond layers 62, in turn, preferably comprise silver or a silver alloy, such as a silver-palladium composition having a three-to-one (3:1) weight ratio, or a silver-platinum composition having 99:1 weight ratio. Silver or a silver alloy is utilized because silver has inherent plasticity and, therefore, can soak up the kinetic energies of the copper particles as they impact the bond layers 62 for successful deposition. However, utilizing silver in the bond layers 62, as opposed to utilizing silver-palladium or silver-platinum, is generally preferred since a silver-palladium or silver-platinum composition is generally more expensive than silver alone. Moreover, it is possible to spray relatively thick copper layers on the silver, and the palladium is not required. This is because the thick copper inhibits the tin and silver diffusion thereby eliminating the growth of brittle tin-silver compounds at the welded joint. The bond layers 62 are formed upon the substrate 60 before the substrate 60 is detachably mounted to the mounting pad 34 for spraying. Silver-based material is not the only possible bond material. Any plastically deformable material would suffice, such as metals including, but not limited to, Ni, Cu, Zn, Nb, Ta, W, Sn, Sb, and mixtures thereof.

The bond layers 62 are preferably formed by a conventional screen printing technique and facilitate the deposition of the copper particles upon the substrate 60. Copper particles which would not otherwise adhere very well to the substrate 60 are deposited onto the substrate 60 with a bond layer 62. It is to be understood that the bond layers 62 are printed onto the substrate 60 in predetermined patterns to thereby define the ultimate circuit patterns formed when the copper particles are deposited onto the bond layers 62. Alternatively, the copper particle size distribution can be adjusted so that they will adhere to the substrate 60 without the silver bond layer. Copper particles in the size range of 25 to 45 micrometers have been deposited on and adhered to alumina substrates without a silver bond layer by the method of the invention. The best adhesion was achieved for copper particles less than 25 micrometers. Therefore, copper particle size distribution can be adjusted so that they adhere well to the substrate. It is preferred to have particle size of 25 microns or less. The lower limit to particle size is a practical one since if particles are too small, on the order of 5 microns or less, they tend to drift away due to aerodynamics rather than deposit on the substrate.

As illustrated in FIG. 1 according to the present invention, a powder of copper-based particles is delivered into the mixing chamber 18 of the nozzle 10 via feed line 26 from powder feeder 44. At the same time, pressurized and heated gas is also delivered into the mixing chamber 18 via conduit 28 from in-line heater 32. As a result, the copper particles are entrained within the streamlined flow of a carrier gas established by the flow straightener 22 to thereby form a jet. As the carrier gas and the copper particles move through the throat 16 of the nozzle 10, both the carrier gas and the copper particles 100 exit the nozzle 10 at supersonic velocities. More particularly, the nozzle 10 facilitates carrier gas velocities greater than 1000 m/s while copper particle velocities range from about 500 m/s to about 600 m/s. In general, copper particle velocities are dependent on particle size such that the smaller copper particles have velocities which generally approach the maximum carrier gas velocity while the larger copper particles have slower velocities. In this way, the copper particles 100 are expelled from the nozzle 10 via the exit aperture 20 such that, ultimately, the copper particles 101 are deposited onto a bond layer 62 formed on the substrate 60. Once deposition of the copper particles is complete and the copper circuit is thereby formed over the bond layers 62 on the substrate 60, kinetic spray processing according to the present invention is then complete. Thus, the substrate 60 can then be removed from the mounting pad 34.

In the above-described kinetic spray system, it should be noted that the exit aperture 20 of the nozzle 10 is selectively spaced away from the bond layers 62 on the substrate 60 by a predetermined standoff distance 64. The standoff distance 64 can be adjusted by computer-controlled manipulation of the motion stage 36. In addition, it is also important to note that the purpose of heating the gas within the kinetic spray system with the heater 32 is not to heat the copper particles but rather to increase the velocity of the carrier gas through the nozzle 10. More particularly, the carrier gas is heated to increase the shock wave velocity in the gas. As a result, the velocities of the copper particles are also increased as they move with the carrier gas through the nozzle 10. In this way, the rate of copper deposition can generally be controlled by merely controlling the temperature of the carrier gas. That is, in general formulaic terms, the velocities of the copper particles are directly related to the square root of the temperature of the carrier gas, and the velocities of the copper particles are inversely related to the square root of the mass of the carrier gas. In the kinetic spray system according to the present invention, the carrier gas temperature is generally maintained within the range of about 100° C. to about 500° C. Of course, in the process, the copper particles are vicariously heated as well, but only to temperatures well below the melting temperatures of the copper particles. In particular, copper has a melting temperature of about 1083° C. (1357° K). Thus, the maximum temperature of the carrier gas in the kinetic spray system according to the present invention is only about one-half (½) of the melting temperature of the copper particles. As a result, the copper particles impact the silver bond layers 62 in solid form, not molten form. Furthermore, if a particularly high carrier gas velocity is desired, helium should be utilized in the kinetic spray system instead of air, for helium has a smaller molecular weight than air, and the shock wave velocities scale inversely with the square root of the molecular weight of the gas.

Figure 3:
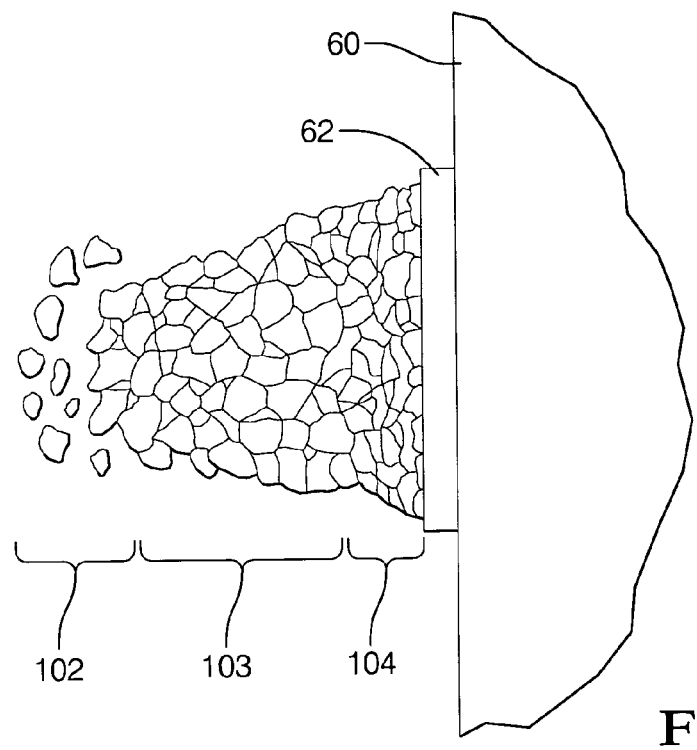
FIG. 3 is a side view particularly highlighting the deposition and plastic deformation of copper particles onto a silver bond layer formed upon an alumina substrate.

FIG. 3 is a side view illustrating the deposition and plastic deformation of copper particles onto the bond layer 62 formed upon the substrate 60. According to the present invention, the copper particles are neither melted nor softened prior to impingement onto the bond layers 62 of the substrate 60. According to the present invention, the copper particles are roughly spherical and are sieved to have particle diameter sizes of about 15 to 150 microns, but could be 45 to 63 microns, and are accelerated to high linear rates of speed such that the copper particles are plastically deformed and deposited onto the bond layers 62 of the substrate 60. The plastic deformation of the copper particles is the result of particulate kinetic energy being converted to mechanical deformation, strain energy and thermal energy upon impact with the substrate 60. That is, in order for a given copper particle to adhere, the collision with the bond layer 62 cannot be purely elastic. Instead, the collision must be substantially inelastic, and the copper particle must lose enough of its kinetic energy such that it cannot escape from the bond layer 62 formed on the substrate 60. According to the present invention, the bond layer 62 facilitates the transference of the kinetic energy of a copper particle to ensure indirect adhesion to the substrate 60. To even further help ensure this transference of kinetic energy, the copper particles, according to the present invention, are directed substantially normal to the surface of the bond layers 62 on the substrate 60. In another embodiment, no bond layer is required. Rather, the kinetic energy of the copper particles is transferred to thermal and mechanical energies primarily by plastic deformation of the copper particles upon impact directly with the electrically insulating substrate.

As a result of the impact with the bond layers 62 on the substrate 60, the aspect ratios of the copper particles are substantially changed such that the copper particles become somewhat pancake-like and are deformed into conformation with the substrate 60 and with each other. That is, after the initial copper particles impact and adhere to the bond layer 62 of the substrate 60, the subsequent copper particles then impact the previously-deposited particles, deform, and bond to produce a rapidly increasing copper coating over the bond layer 62 on the substrate 60. As the copper particles accumulate over the bond layers 62, the copper particles also tend to mechanically interlock with each other as well. In addition, the conversion of the particulate kinetic energy to thermal energy upon impact may cause thermal softening of the copper particles which also facilitates their bonding and/or interlocking with each other. As layers of copper particles are deposited over the bond layers 62, the early deposited copper layers formed closest to the bond layers 62 tend to have relatively low overall porosities. As a result, good electrical conductivity through the copper lines formed on the bond layers 62 is achieved.

As FIG. 3 illustrates, the bonding mechanism for the kinetic spray process according to the present invention is a complex process including both particle-bond layer interaction and particle-particle interaction. In particular, copper particles 104 which first impact the bond layer 62 at high velocities tend to deform and produce craters in the surface of the bond layer 62 and ultimately define a first-layer build up of particles on the bond layer 62. The range of kinetic energies of the first copper particles 104 includes energies both sufficient to crater the bond layer 62 and not bond thereto and sufficient to crater the bond layer 62 and successfully bond thereto. These first copper particles 104 are the most prone to extensive plastic deformation. Some mechanical bonding also occurs in this first layer of copper particles 104 as the particles deform and fill voids in the cratered surface of the bond layer 62. Those copper particles which bond directly to the bond layer 62 thereby provide a bonding surface for subsequent incoming copper particles.

Further in FIG. 3, after the first layer of copper particles 104 is established, a is second layer of copper particles 103 is formed over the first layer 104 wherein the particles comprising the second layer are plastically deformed and conformed to fill the particle voids defined by the first layer of particles 104. In this second layer of copper particles 103, void reduction between particles occurs to the point where mechanical interlocking and particle-to-particle bonding is achieved. Last incoming copper particles 102 impact and peen the second layer of particles 103 thereby generally contributing to the void reduction and mechanical interlocking between particles in the second layer. These last particles 102 are not plastically deformed to the extent of the first and second layers of particles and generally experience minimal particle deformation. However, these last particles 102 tend to rotate and realign themselves upon impact so that they follow paths of least resistance and fill voids established by the second layer of particles 103. Due to the minimal deformation of the last particles 102, the copper layer defined by these last particles 102 has more voids and is, therefore, more porous than both the first layer of particles 104 and the second layer of particles 103. More particularly, the copper layer defined by these last particles 102 is characterized by having minimal mechanical interlocking, minimal heat generation, and minimal particle-to-particle bonding.

Figure 5:
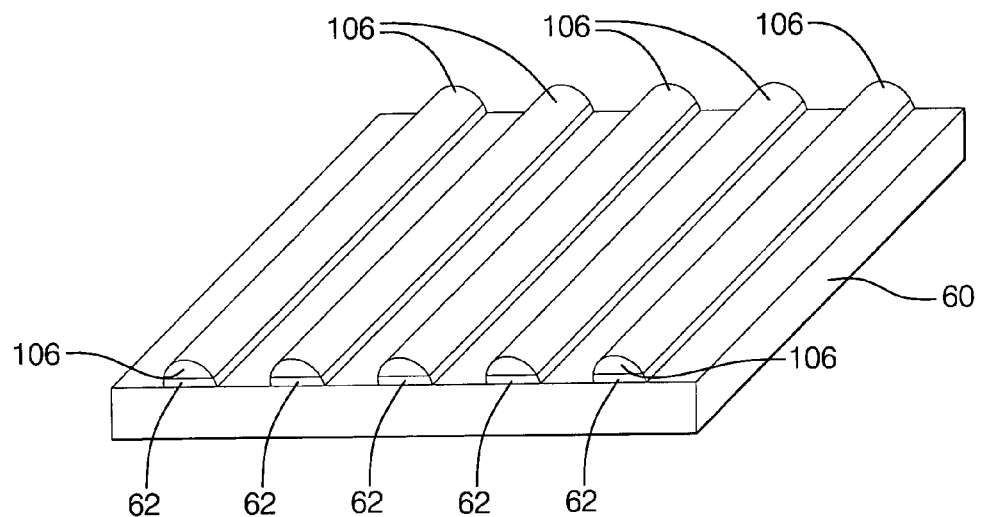
FIG. 5 is a partial sectional and a partial perspective view of an alumina substrate with parallel strips of silver bond layers having layers of copper particles deposited thereon.

Once deposition of copper particles according to the present invention is finished, the substrate 60 can then be removed from the mounting pad 34 of the kinetic spray system. FIG. 5 is a partial sectional and a partial perspective view of the substrate 60, after copper deposition, with parallel strips of bond layers 62 having layers of deposited copper particles 106 thereon. The basic copper-based circuit configuration in FIG. 5 includes an electrically insulative substrate 60, a bond layer 62 which is formed over select portions of the substrate 60 according to a desired shape of the circuit, and an electrically conductive layer 106 including plastically deformed particles of copper deposited on the bond layer 62. The substrate 60 may comprise electrical insulators including, but not limited to, aluminum oxide, aluminum nitride, or boron nitride. The bond layer 62 preferably includes silver or a silver alloy, such as, for example, silver-palladium. Silver-based material is not the only possible bond material. Any plastically deformable material would suffice, such as metals including, but not limited to, Ni, Cu, Zn, Nb, Ta, W, Sn, Sb, and mixtures thereof. The bond layer 62 has a preferred thickness of approximately 10 to 12 micrometers.

Figure 4:
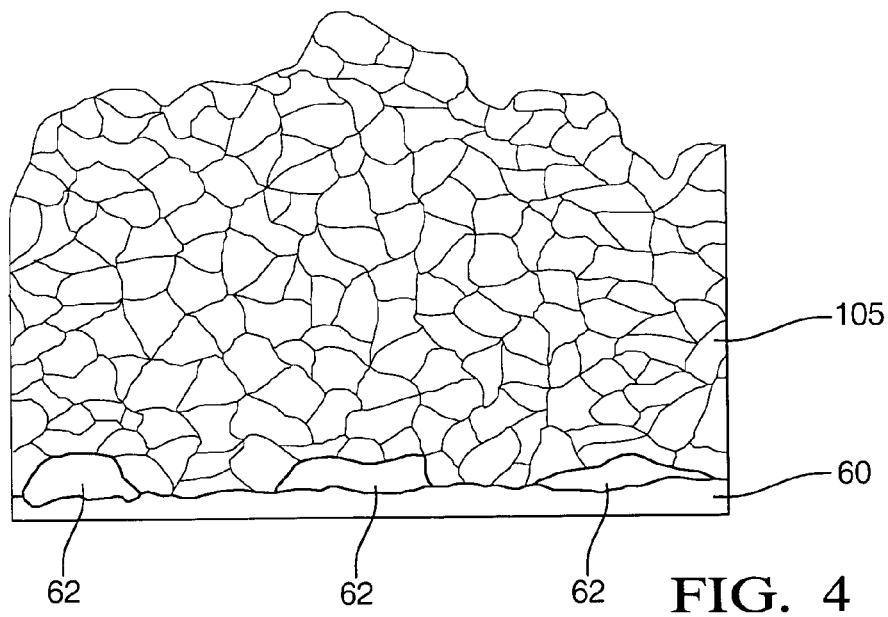
FIG. 4 is an illustration of deposited copper particles deposited onto and bridging strips of silver bond layers formed upon an alumina substrate.

A very significant advantage of the present invention is that a copper-based circuit formed by kinetic spray according to the present invention generally does not require the copper particles to be sprayed through a precisely positioned, pre-patterned mask to form predetermined circuit patterns on the substrate 60. More particularly, relatively larger copper particles do not adhere directly to the substrate 60. Since such particles only adhere to the bond layers 62, the kinetic spray system according to the present invention need only be generally directed to the substrate 60 without a mask. This arrangement is readily adaptable for commercial use since the copper particles 100 expelled via the exit aperture 20 of the spray nozzle 10 will generally only adhere to the pre-patterned bond layers 62. Thus, inadvertently misdirecting copper particles onto areas of the substrate 60 not covered by the bond layers 62 is generally of no consequence, for the relatively larger copper particles generally will not adhere directly to the substrate 60 itself. However, in utilizing a kinetic spray process according to the present invention, the strips of bond layers 62 must generally be sufficiently spaced apart upon the substrate 60 to avoid undesired bridging of deposited copper between adjacent strips of bond layers 62. FIG. 4 is an illustration of the bridging phenomenon wherein deposited copper particles 105 bridge parallel strips of bond layers 62 formed upon the substrate 60. As stated, by proper selection of process parameters such bridging is avoided.

Formation of a copper-based circuit by kinetic spray according to the present invention is further demonstrated by way of the following examples.

EXAMPLE 1

The kinetic spray system equipment utilized in this example is generally illustrated in FIG. 1 and in FIG. 2. A carrier gas was delivered to the mixing chamber 18 via the flow straightener 22 at a pressure of about 2 MPa (300 psi) and at a temperature that was controlled between 100° C. and 500° C. Simultaneously, a copper powder was delivered to the mixing chamber 18 at a pressure of about 2.4 MPa (350 psi). The mixing chamber 18 of the nozzle 10 emptied into the throat 16, and the throat 16 had a selected diameter such that the carrier gas and copper particles achieved a supersonic velocity as they exited the nozzle 10. The copper particles accelerated to high velocities due to drag effects with the carrier gas. Such high velocities caused the copper particles to plastically deform as they impacted the bond layers 62 of the substrate 60, thereby forming a multi-layered copper-based circuit on the substrate 60.

In this example, aluminum oxide (alumina) substrates, measuring 140 by 80 millimeters and having a thickness of about one millimeter, were used. The alumina substrates had screen-printed silver (Ag) bond layer coatings having thicknesses of approximately 12 micrometers. Here, both solid and patterned bond layer coatings were used. In addition, the copper powder was sieved such that the copper particles generally had diameters within the range of approximately 45 micrometers to 63 micrometers. The powder delivery was controlled by the auger speed of rotation of the powder feeder. The standard revolutions-per-minute (rpms) used by the powder feeder in this example was 500. Increasing or decreasing the delivery rate resulted in a corresponding increase or decrease in the copper film thickness.

In this example, the following spraying conditions were generally held constant: powder feeder pressure=2.4 MPa (350 psi), carrier gas (air) pressure 2.0 MPa (300 psi), nozzle-to-target standoff distance=19 millimeters (0.75 inch), and powder feeder delivery rate=500 rpm. The variable parameters in this example included the carrier gas temperature (100 to 500° C.), traverse speed of the target, and the size of nozzle utilized.

Nozzles of different sizes were used in this example. The standard nozzle was a short nozzle with length of entire nozzle 110 mm, dimensions of exit aperture 10 mm×2 mm. The other nozzle, was longer than the short nozzle and thereby permitted longer residence time for the copper particles to accelerate to higher velocities. The longer nozzle dimension was length of entire nozzle 300 mm, dimensions of exit aperture 28 mm×2 mm.

With the above kinetic spray conditions in place, results demonstrated that spraying copper particles over silver-coated alumina produce good adhesion, and a continuous layer of copper particles was formed by the kinetic spray. More particularly, for copper particles having diameters of about 45 to 63 micrometers, the operating window for various parameters which produced a well-adhered layer of copper particles over a silver-coated alumina substrate was determined. The most preferred values for these operating parameters are: powder feeder pressure=2.4 MPa (350 psi), carrier gas (air) pressure=2.0 MPa (300 psi), standoff distance between nozzle and substrate=19 mm (0.75 inch), and powder delivery rate=500 rpm. The carrier gas temperature is thought to be material dependent and here was about 150° C. to 635° C. (300° F. to 1200° F.). The traverse target speed is thought to be dependent on a desired coating thickness and here was 13 mm/s. The number of spray passes over a target is optional. Here, only one pass was used. Any number of passes can be used based on desired copper thickness. Here, the nozzle type was short.

Utilizing the above operating conditions in this example, the carrier gas temperature was varied between 150° C. and 450° C. At the highest temperature, the resultant thickness of the copper particle coating was 0.65 millimeters but showed signs of surface oxidation. Previous experimentation indicated that this oxidation occurred only at the surface and did not penetrate into the coating. Samples prepared as per this example had a copper coating thickness of 0.5 mm at 350° C., and a thickness of 0.18 mm at a temperature of 150° C. Within this temperature range, no signs of surface oxidation were present. At temperatures below 150° C., however, results indicated that a continuous copper coating was difficult to obtain.

In this example, for the kinetic spray system to function properly, it was necessary to have a pressure differential of about 0.35 MPa (50 psi) between the powder feeder pressure and the carrier gas pressure. However, when the powder feeder pressure was reduced from 2.4 MPa to 1.6 MPa, and the carrier gas pressure was reduced from 2.0 MPa to 1.2 MPa, while keeping the inlet gas temperature at 350° C., a copper film thickness reduction of 30% and a non-uniform coating was produced.

While maintaining the carrier gas temperature at 350° C., the traverse speed was changed from 6.5 mm/s to 13, 65, and 130 mm/s. As a result, the corresponding copper film thicknesses produced were 0.31 mm, 0.55 mm, 0.07 mm, and 0.02 mm. The general trend for the copper film thickness to drop with increases in the traverse target speed is due to the reduced dwell time of the nozzle in front of the target. However, the logic of this trend was generally not applicable to the slower traverse speed of 6.5 mm/s, whereunder the copper film thickness actually decreased rather than increased. Such is thought to be due to the competition between the deposition forces attempting to deposit the copper particles and the less energetic particles that sand blast the silver-coated surface of the substrate. Slowing the traverse target speed down to 6.5 mm/s allowed for enhancing the latter effect, thereby reducing the anticipated copper film thickness. Such implies that an optimum traverse target speed exists for a given set of spraying parameters. In this example, the thickest copper film attainable from a single pass deposition was 1.2 millimeters at a traverse target speed of 13 mm/s and at a carrier gas temperature of 500° C.

Further in this example, increasing the standoff distance between the nozzle and target to 44 mm (1.75 in) from the standard 19 mm (0.75 in) resulted in reducing the copper film thickness by 50% and also resulted in increasing the width of the spray pattern by 20%. A further increase in the standoff distance reduced the copper film thickness very significantly. On the other hand, decreasing the standoff distance to 6 mm (0.25 inch) did not affect the copper film thickness but did result in a slightly narrower spray pattern.

Figure 6:
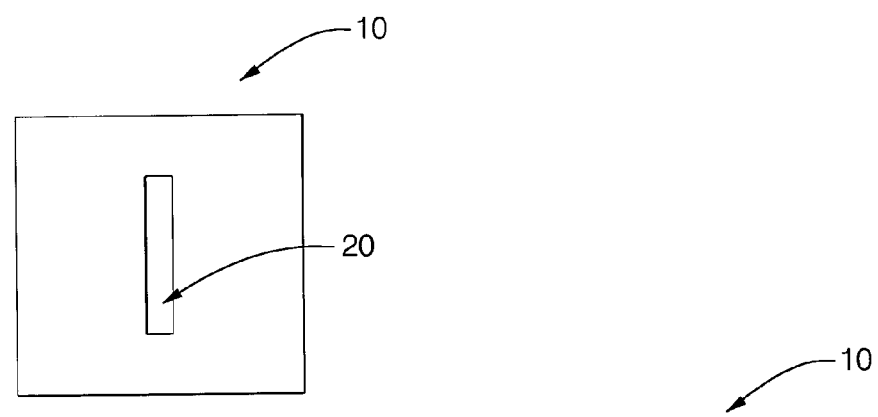
FIG. 6 is an end view of a kinetic spray nozzle oriented such that the rectangular exit aperture is in a vertical position.

In the above example, all the data was obtained using the short nozzle, with the length of the nozzle horizontally situated (see FIG. 1) such that its rectangular exit aperture was in an upright, vertical position (see FIG. 6). As such, with the spray nozzle in a fixed position, the spray patterns upon traversely and horizontally moving targets generated horizontal strips which had widths of several millimeters. For the next portion of this example, the resolution of the kinetic spray process for copper deposition is focused upon. To maintain this focus, the short nozzle and one long nozzle, with the rectangular exit apertures in the vertical position (see FIG. 6) or the 90°-rotated position (see FIG. 7), were individually utilized to generate copper deposits.

Utilizing the short nozzle with its exit aperture in the vertical upright position as in FIG. 6, the width of the horizontally sprayed copper strip was over 10 millimeters. Using a single pass and a traverse horizontal target speed of 12 millimeters per second (12 mm/s), the resultant thickness of the copper film was about 0.5 mm, depending on the carrier gas temperature, and no signs of delamination of the copper film were present.

Figure 7:
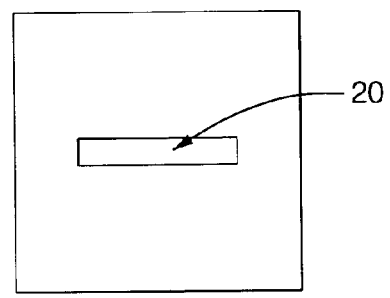
FIG. 7 is an end view of a kinetic spray nozzle oriented such that the rectangular exit aperture is rotated 90°, as compared to FIG. 6, and is in a horizontal position.

When rotating the short nozzle by 90° such that the rectangular exit aperture was situated as in FIG. 7, the width of the copper spray pattern on a horizontally moving target was reduced to about 3 millimeters while the copper film thickness was about 0.3 millimeter. Thus, even with the short nozzle rotated as such, the adhesion of the copper particles to the silver coating on the substrate was successfully maintained. However, to attain a copper spray pattern having a width of less than 3 millimeters, the copper spray had to be directed through a pre-patterned mask during deposition.

In contrast to spraying with the short nozzle, spraying with the long nozzle with the exit aperture in the upright position (see FIG. 6) produced undesirably wider patterns than the short nozzle, so only the results for the long nozzle when rotated by 90° (see FIG. 7) were considered. In particular, copper films were deposited in a single pass on horizontally moving targets at various traverse target speeds ranging from 25 mm/s to 100 mm/s, respectively, while the carrier gas temperature was set at about 350° C. At the lower traverse speed of about 25 mm/s, the deposited copper coating delaminated and did not sufficiently adhere to the silver bond layer. In contrast, when the traverse speed of the horizontally moving target in front of the spray nozzle was increased to about 100 mm/s, the adhesion of the copper particles onto the silver coating was improved. However, although overall adhesion of the copper to the silver coating improved, the thickness of the copper coating was only about 0.1 millimeter.

EXAMPLE 2

To further demonstrate the invention, additional samples were prepared in an attempt to produce copper films with coating thicknesses of 0.25 to 0.37 mm (10 to 15 mils). To accomplish such, two batches of samples were prepared. In this particular example, however, the samples were sprayed through a steel mask (0.4 mm thick) which was positioned in front of adhesion coupons (a substrate with multiple silver bond layers) with a clearance of about 2 millimeters.

The first batch was sprayed with one pass, and the carrier gas (air) temperature was set at about 400° C. (800° F.). The traverse target speed was set at about 19 mm/s (0.75 inch/s). At such settings, copper films having a thickness of about 0.37 mm (15 mils) were successfully produced.

The second batch was sprayed with two passes, and the carrier gas (air) temperature was slightly reduced to 370° C. (725° F.) in order to avoid surface oxidation. At such settings, copper films having thicknesses which exceeded 0.5 mm (20 mils) were successfully produced.

EXAMPLE 3

This example demonstrated the operability of the method for directly spraying copper particles onto ceramics without the use of a bond layer. In this example, copper coating was applied having good adhesion to the ceramic substrate for selected particle size. Initially, four different size groups of copper powder particles were prepared, the ranges were 63 to 90 micrometers, 45 to 63 micrometers, 25 to 45 micrometers, and less than 25 micrometers. Each of these groups of particles was obtained by sieving. For the smallest group, no single particle had a size greater than 25 micrometers. The ceramic substrates were alumina ($Al_2O_3$) and aluminum nitride (AlN). Both the short and long nozzles were used.

In this example, the following spraying conditions were generally held constant: powder feeder pressure=2.4 MPa (350 psi), carrier gas (air) pressure=2.0 MPa (300 psi), stand-off distance between nozzle and substrate=19 mm (0.75 inch), powder delivery rate=500 rpm and carrier gas temperature=370° C. (700° F). In this example, the experimental set-up was the same as shown in FIG. 1, except that the bond layer 62 was not present. Therefore, the copper particles 100 were sprayed directly onto substrate 60 and deposited as an adhered layer on substrate 60.

In one test, it was attempted to spray copper particles directly on alumina or aluminum nitride substrates (without a bond layer) using the powder sizes 63 to 90 and 45 to 62 micrometers. However, it was not possible to form a continuous and uniform coating on either substrate. This was found to be the case for the two nozzles examined. Thus, although adhered copper coating was achieved, it was not of adequate quality for microelectronic use.

In another test, the powder size range of 25 to 45 micrometers was sprayed directly on alumina ($Al_2O_3$) and a continuous uniform coating was produced using the short nozzle. The long nozzle, for the same powder size, did not produce a continuous coating on alumina. The same Cu powder size (25 to 45 micrometers) was sprayed on aluminum nitride substrates (AlN) using both nozzles (short and long). It was possible to produce a continuous copper coating.

Using the smallest powder size (less than 25 micrometers) it was possible to form copper coatings on alumina and aluminum nitride substrates, without a bond layer, using both the short and long nozzles.

By this example, it was possible for the first time, to form a continuous conductive copper path on a insulative substrate without the need for a bond layer to facilitate adhesion. This result is striking since it is now possible to prepare conductive paths directly on a substrate, economically and with characteristics of adhesion and continuity suitable for service in an operating environment.

While the present invention has been described in what is presently considered to be the most practical and preferred embodiment and/or implementation, it is to be understood that the invention is not to be limited to the disclosed embodiment, but on the contrary, is intended to cover various modifications and equivalent arrangements included within the spirit and scope of the appended claims, which scope is to be accorded the broadest interpretation so as to encompass all such modifications and equivalent structures as is permitted under the law.

The invention claimed is:

1. A process for forming a copper-based circuit, said process comprising the steps of:
   providing an electrically insulative substrate;
   forming a bond layer comprising silver over select portions of said substrate according to a desired shape of a circuit; and
   depositing copper on said bond layer by the steps of:
      introducing copper particles having a particle size of about 45 microns to about 150 microns into a pressurized carrier gas;
      forming said pressurized carrier gas and said copper particles into a supersonic jet; and
      directing said jet toward said bond layer formed over said substrate without use of a mask and from a standoff distance of from 5 to 19 millimeters such that said jet has a velocity sufficient to cause plastic deformation of said copper particles onto said bond layer, thereby forming an electrically conductive layer only on said bond layer in the desired shape of the circuit by selective adherence of said copper particles to said bond layer.

2. The process according to claim 1, wherein said substrate comprises an insulative material selected from the group consisting of aluminum oxide, aluminum nitride, boron nitride, silicon carbide, silicon nitride, diamond, and mixtures thereof.

3. The process according to claim 1, wherein said bond layer comprises silver, silver-palladium or silver-platinum.

4. The process according to claim 1, wherein said bond layer has a thickness of about 10 micrometers to about 12 micrometers.

5. The process according to claim 1, wherein the step of forming a bond layer comprising silver over select portions of said substrate is achieved by screen printing said bond layer onto said substrate.

6. The process according to claim 1, wherein said carrier gas has a pressure of about 1.2 MPa to about 2 MPa.

7. The process according to claim 1, wherein said carrier gas has a temperature of about 100° C. to about 500° C.

8. The process according to claim 1, wherein said jet is directed substantially normal to the surface of said bond layer formed over said substrate.

* * * * *